United States Patent
Xu et al.

(10) Patent No.: US 8,287,996 B2
(45) Date of Patent: Oct. 16, 2012

(54) COATING FOR A MICROELECTRONIC DEVICE, TREATMENT COMPRISING SAME, AND METHOD OF MANAGING A THERMAL PROFILE OF A MICROELECTRONIC DIE

(75) Inventors: Dingying Xu, Maricopa, AZ (US); Leonel R. Arana, Phoenix, AZ (US); Nachiket R. Raravikar, Gilbert, AZ (US); Mohit Mamodia, Chandler, AZ (US); Rajasekaran Swaminathan, Swaminathan, AZ (US); Rahul Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 243 days.

(21) Appl. No.: 12/653,791

(22) Filed: Dec. 21, 2009

(65) Prior Publication Data
US 2011/0151624 A1 Jun. 23, 2011

(51) Int. Cl.
*B32B 27/32* (2006.01)

(52) U.S. Cl. ......... 428/220; 428/212; 428/213; 428/421

(58) Field of Classification Search ............... 438/119; 428/212, 213, 220, 421
See application file for complete search history.

(56) References Cited

U.S. PATENT DOCUMENTS

| | | | |
|---|---|---|---|
| 2008/0153960 A1* | 6/2008 | Meneghetti et al. | 524/404 |
| 2008/0251904 A1* | 10/2008 | Theuss et al. | 257/679 |
| 2010/0127386 A1* | 5/2010 | Meyer-Berg | 257/698 |

FOREIGN PATENT DOCUMENTS

JP 2008169513 * 7/2008

OTHER PUBLICATIONS

Machine translation of JP 2008169513, Kon Tatsuichiro, Jul. 24, 2008, Reflective thermally conductive fillers, their polymer compositions, their layers, reflective films, electronic substrates, and coverlay films.*

* cited by examiner

*Primary Examiner* — Angel Roman
(74) *Attorney, Agent, or Firm* — Kenneth A. Nelson

(57) ABSTRACT

A coating for a microelectronic device comprises a polymer film (131) containing a filler material (232). The polymer film has a thermal conductivity greater than 3 W/m·K and a thickness (133) that does not exceed 10 micrometers. The polymer film may be combined with a dicing tape (310) to form a treatment (300) that simplifies a manufacturing process for a microelectronic package (100) and may be used in order to manage a thermal profile of the microelectronic device.

11 Claims, 3 Drawing Sheets

# COATING FOR A MICROELECTRONIC DEVICE, TREATMENT COMPRISING SAME, AND METHOD OF MANAGING A THERMAL PROFILE OF A MICROELECTRONIC DIE

FIELD OF THE INVENTION

The disclosed embodiments of the invention relate generally to microelectronic devices, and relate more particularly to films or other treatments for such devices.

BACKGROUND OF THE INVENTION

Microelectronic device technology is rapidly moving toward complex multi-chip packaging involving thin, high-power die. The die crack risk for thin die is significant, as is the thermal management demand. Strict package height constraints dictate that any solution must itself be relatively thin in order to avoid adding excessively to overall package thickness.

BRIEF DESCRIPTION OF THE DRAWINGS

The disclosed embodiments will be better understood from a reading of the following detailed description, taken in conjunction with the accompanying figures in the drawings in which.

Figure 1:
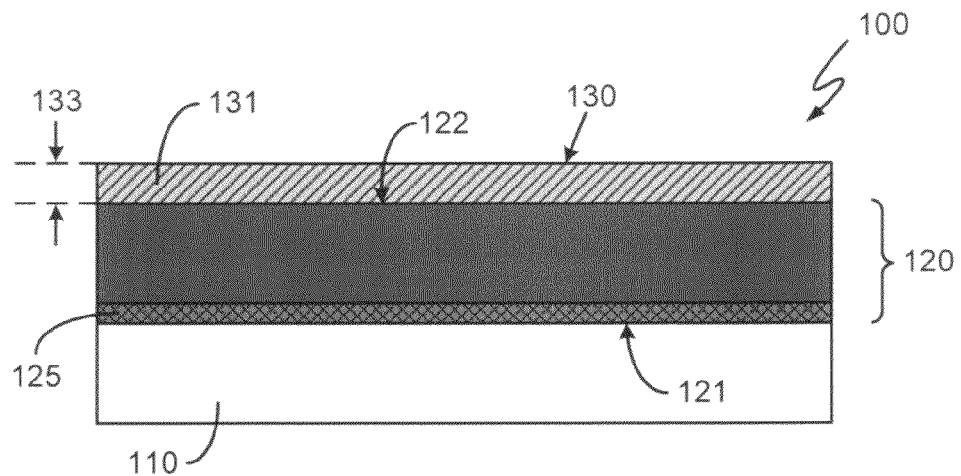
FIGS. 1 and 2 are cross-sectional views of a coating for a microelectronic device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a coating for a microelectronic device comprises a polymer film containing a filler material. The polymer film has a thermal conductivity greater than 3 W/m·K and a thickness that does not exceed 10 micrometers. The polymer film may be combined with a dicing tape to form a treatment that simplifies a manufacturing process for a microelectronic package and may be used in order to manage a thermal profile of the microelectronic device.

Existing bare die package assembly and testing procedures harbor a multitude of potential defect sources, including manual handling of piece parts and media, tool contact with the die backside (such as saw backside chipping and the like), test pedestal scratching, and so forth. All of these sources, and others, lead to die crack fails either during manufacture or in reliability testing. Thus, an ideal solution would provide high scratch resistance to prevent die cracking while also providing a thin and highly thermally conductive material that lowers thermal resistance and enables effective heat removal from the die. Currently there exist no acceptable solutions that provide both die backside scratch resistance and heat dissipation. Existing scratch resistant coatings are typically poor thermal conductors and also have high thickness profiles that increase thermal resistance according to the generalized relationship: thermal resistance ∝ (thickness/thermal conductivity), and thus are not effective in conducting the heat away from the die.

The issues outlined above may possibly be mitigated or eliminated by the use of a die backside film (DBF). This is, typically, a wafer level film, of perhaps 1 to 50 micrometers (abbreviated herein as "microns" or "μm") thick, that may be laminated on or otherwise applied to the backside of a silicon (or other) wafer or die. Such application may take place after a wafer-thinning process. The DBF is typically a polymer/inorganic composite and is permanently attached to the back side of a microelectronic device such as a semiconductor die following a curing of the film.

Among other things, such films increase the reliability of a microelectronic package containing the coated die and offer significant protection against die cracking and warping during package assembly and handling. Such films can be especially advantageous for products sold or shipped as bare die packages, which otherwise (i.e., in the absence of such films) would be more likely to be subjected to wear, abrasion, or other backside damage introduced during the assembly/test process (or arising from other sources), possibly leading to poor die backside visual appearance and/or die cracking during transport or use. However, most existing DBFs are thermally non-conductive, leading to problems with heat dissipation and thus potentially to loss of performance and even die failure. For example, existing DBFs contain silica fillers which, although they provide good mechanical properties (higher modulus), lack acceptable thermal conductivity properties. The thermal conductivity of a silica-filled DBF is less than 1 W/m·K, which is too low for many applications.

What is needed, therefore, is a thin and highly thermally-conductive (high k) DBF for mobile bare die applications, for desktop package applications where the high k DBF will come into thermal contact with a thermal interface material (TIM) and/or an integrated heat spreader (IHS), and for similar environments. Such a film would reduce the yield loss attributable to die-crack that occurs during assembling and handling for microelectronic (and especially for high power) devices. The thermal conductivity of the film would reduce any temperature increment that may occur due to the film's application and would allow effective heat removal from the die.

Embodiments of the invention provide these and other benefits by enabling a very thin film having high scratch resistance and high thermal conductivity and having the ability to be tailored to allow laser marking. The enabling of laser marking on the die backside saves space that would otherwise be used for such marking on the package substrate or elsewhere, thus leading to space savings and a smaller, lower-cost package. The foregoing characteristics of the inventive DBFs are achieved in various embodiments with the help of stiff, thermally-conducting particles in polymer, as will be discussed in detail below. Stiffer particles may help enhance abrasion resistance, while thermally-conductive particles may help enhance thermal dissipation away from the die.

Figure 2:
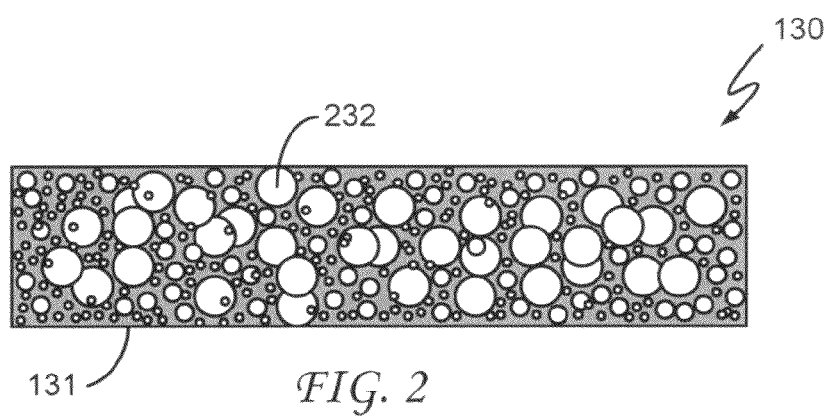

Referring now to the drawings, FIGS. 1 and 2 are cross-sectional views of a coating 130 for a microelectronic device according to an embodiment of the invention. Coating 130 is shown in FIG. 1 as being attached to a die 120 that is, in turn, attached to a substrate 110 as part of a microelectronic package 100. FIG. 2 illustrates coating 130 alone. As illustrated in FIGS. 1 and 2, coating 130 comprises a polymer film 131 containing a filler material 232. (Coating 130 and polymer film 131 are essentially the same thing, with the difference in names being maintained principally for discussion and identification purposes.) Polymer film 131 can have a glass transition temperature ($T_g$) that is greater than 50° Celsius (° C.).

Polymer film 131 is a DBF having a thermal conductivity greater than 3 W/m·K and a thickness 133 that does not exceed 10 µm (and can actually be significantly thinner). One reason for this relatively small thickness maximum is that for any material of a given thermal conductivity, a thinner film will introduce a lower resistance to heat dissipation from the microelectronic device. Thus for a given device power, a thinner film will enable the device to run at a lower temperature than would a thicker film. For example, for a device with a thermal design power (TDP) of greater than 10 Watts, a film with thermal conductivity of 3 W/m·K and thickness of greater than 10 µm is estimated to cause the device to run hotter by over 1° C. (relative to a die without DBF). A rise in temperature of greater than 1° Celsius is generally undesirable as it can reduce the performance and reliability of the microelectronic device. Many more materials may thus be considered for a thin film 131 than would be the case for a thicker film. In certain embodiments, polymer film 131 has a post-cure Young's modulus at room temperature (taken herein to be approximately 300° Kelvin (° K)) that is greater than 3 GPa. Polymer film 131 may be based on mechanically rigid thermosets including various epoxies and epoxy resins, thermoplastics such as polyethylene terephthalate (PET) and the like, polyimides of various kinds, and similar materials. As further discussed below, a double or other multi-layer film design can be used to meet required lamination and tackiness conditions.

Die 120 has a front side 121 containing active circuitry 125 and a back side 122 opposite front side 121. As shown, polymer film 131 is located at back side 122, as expected for a die backside film.

Filler material 232 may comprise micro- and/or nano-scale fillers based on materials that have high thermal conductivity [e.g., k>10 W/m·K] and high abrasion resistance. As suggested above, such fillers may be filled into an epoxy matrix. As a particular example, filler material 232 can comprise particles of one or more of tungsten, topaz ($Al_2SiO_4$), chromium, aluminum, aluminum oxide ("alumina," or $Al_2O_3$), aluminum nitride (AlN), tungsten carbide (WC), silicon carbide (SiC), boron, boron carbide ($B_4C$), boron nitride (BN), nickel, nickel vanadium (NiV, with, for example, less than 0.05% V), graphite, carbon powder, carbon fibers, and diamond, among others. Nanotubes and nanowires of the foregoing substances can also be used. Each of the listed materials has a thermal conductivity of at least 10 W/m·K, with several of them (notably diamond as well as nanotubes of various ones of the materials) having thermal conductivities of 1000 W/m·K or more.

Particles, nanotubes, nanowires, and similar structures as described above can be uniform in size or, as in the embodiment of FIG. 2, can be of multiple sizes. In certain embodiments, the particles have a maximum size of 1 µm, with many particles being far smaller (e.g., with a largest dimension of 100 nanometers (nm) or less). The desirability of nano-sized fillers comes at least in part from film thickness constraints (thinner films provide better heat release). In other words, nano-sized fillers provide properties such as high scratch resistance without sacrificing thermal conductivity at much lower thicknesses than do corresponding films that are filled with larger particles.

Filler loading within the epoxy matrix may, in one embodiment, be perhaps 70-95 percent by weight. As an example, the fillers may be treated with silane or siloxane coupling agents or with epoxy amines or the like in order to enable better matrix-filler interfacial strengths and dispersion. In particular embodiments, the fillers (e.g., one or more of those mentioned above, or others) incorporated into film 131 improve performance of TIMs that are to be later applied on the die. For example, Au-coated Ni fillers may be used to improve wetting of and react with solder-type TIMs.

In certain embodiments, the foregoing structures are made by first surface treating the fillers, mixing the treated fillers into uncured epoxy resin using solvent, spin coating the resulting film onto the back side of a wafer, and then evaporating the solvent and curing the epoxy. In particular embodiments, the use of solvent may be omitted (e.g., in order to prevent a potential voiding risk in the film) and the fillers may be mixed directly into the epoxy resin, followed by spin coating and cure. Spin coating can create finer thicknesses with good thickness control, achieved by tailoring viscosity, spinning revolutions per minutes (rpm), composite volume, etc. Films on the order of 5-10 μm or less (as well as thicker films) may be coated using these techniques.

The fillers provide both increased thermal conductivity as well as increased modulus (stiffness). The type, size, and content of the fillers and the DBF thickness can be controlled to manipulate the thermal conductivity as desired. The filler parameters as well as the resin chemistry can be optimized to provide the required modulus and, thus, die-crack prevention. In this regard, the simple rule of mixture predicts that if an abrasive (mechanically stiff) material is mixed in a polymer matrix, the resulting composite will have good abrasion resistance, according to the equation $E_{total}=E_mV_m+E_fV_f$, where E is the property being measured, V are volume fractions, m=matrix and f=filler. (Several of the ceramic particles proposed above are known abrasives, with modulus of a few hundred GPa.) The expected improvement in thermal conductivity arises out of a similar argument.

For many reasons, including security, branding, inventory control, and the like, it may be advantageous to have the ability to make a readable mark on die 120. Such marks may be made, for example, by ink printing or by laser engraving, with the latter method often being preferable because it offers higher contrast. In order for such laser engraving to be visible, however, the engraved areas must provide sufficient contrast with the areas that have not been engraved. Accordingly, a colorant such as carbon black or some other pigment may be added to polymer film 131; this increases the contrast between laser-engraved and non-engraved areas on the backside of die 120 and allows laser markings to be made there instead of elsewhere on the package at the cost of increased package size.

In order to be useful in a high-volume manufacturing environment, coating 130 must be such that it can be reliably applied to die 120 under suitable manufacturing conditions. Among other issues, various lamination and tackiness requirements must be considered. For example, with a glass transition temperature greater than 50° C., polymer film 131 may typically be placed in a tape-n-reel system for shipment without sticking to the cover tape, even under relatively extreme temperature and humidity conditions that are sometimes encountered during shipment. However, the otherwise-desirable high $T_g$ may lead to poor adhesion—and possibly delamination—between die and film. In some embodiments, the foregoing requirements are met, and the corresponding manufacturing issues overcome, by using the double or other multi-layer design for polymer film 131 that was mentioned above and that will now be discussed in further detail, with reference first to FIG. 3.

Figure 3:
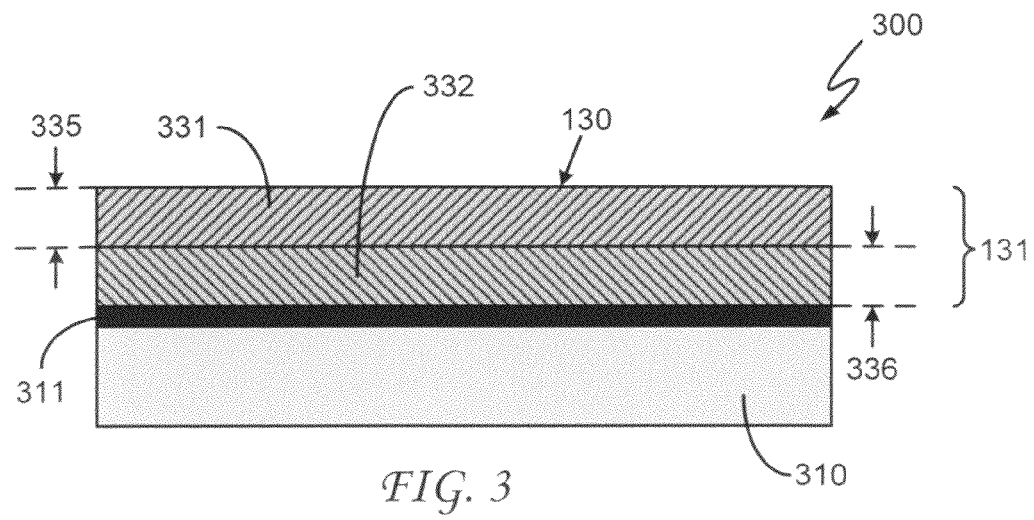
FIG. 3 is a cross-sectional view of the coating of FIGS. 1 and 2 according to a different embodiment of the invention.

FIG. 3 is a cross-sectional view of coating 130 in an embodiment in which polymer film 131 has more than one layer. As illustrated in FIG. 3, film 131 comprises a layer 331 having a thickness 335 and a first filler content and a layer 332 having a thickness 336 and a second filler content. Film 131 is shown as part of a treatment 300 that also includes a dicing tape 310 attached to layer 331 with an adhesive layer 311. Treatment 300, dicing tape 310, and adhesive layer 311 will be further discussed below.

Layers 331 and 332 can have similar base chemistries in order to enable strong adhesion between them. The two layers are depicted as having equal thicknesses, but in various embodiments the layers can be of unequal thickness, with either of the two layers being the thicker one. As an example, for an overall film thickness of 10 microns, layers 331 and 332 can have respective thicknesses of 2 and 8 μm, 5 and 5 μm, 6 and 4 μm, or any other thickness combination.

As an example, layer 331 can have a glass transition temperature that is less than 80° C. and layer 332 can have a glass transition temperature that is greater than 50° C. This results in a film that on one side becomes tacky below 80° C. (to allow lamination to the silicon) and on the other side remains non-tacky up to temperatures of at least 50° C. (to prevent sticking to tape and reel or pick and place tooling). The side with the lower $T_g$ (layer 331) would be placed next to die 120 for lamination thereto while the side with the higher $T_g$ (layer 332) would be placed opposite the die in order to provide a non-tacky backside coating for die 120. As an example, the difference in layer properties can come from slight changes in chemistry and filler content. The tacky layer (layer 331), for example, is likely to have a lower filler content than the non-tacky layer (layer 332).

The application of film 131 to die 120 can be greatly simplified if the film is applied at the wafer level rather than at the individual die level. Although not required in all embodiments, dicing tape 310 can be useful in a wafer-level lamination procedure that is followed by a singulation process, as will be discussed in further detail below.

Figure 4:
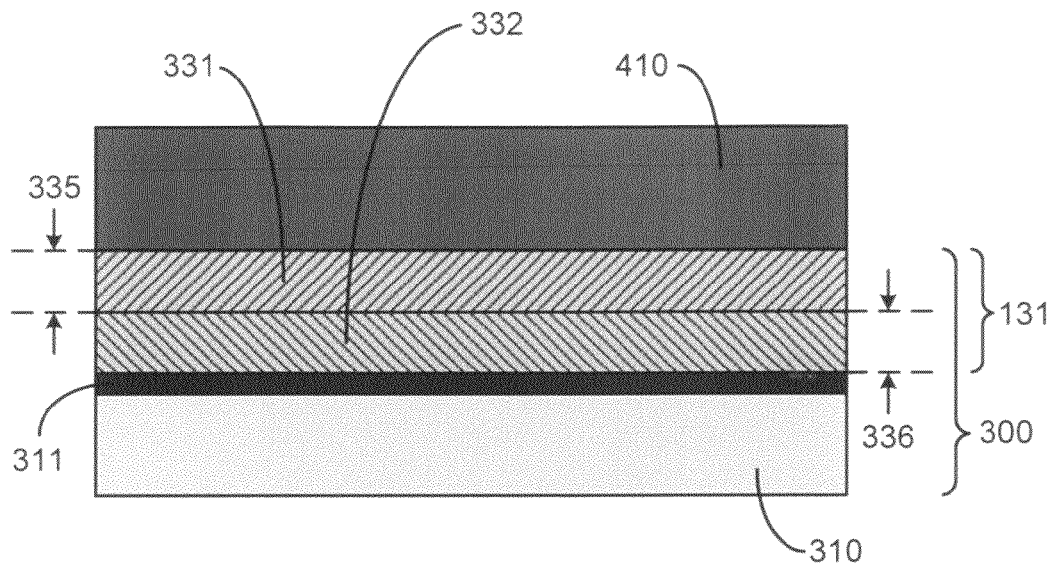
FIG. 4 is a cross-sectional view of a treatment including the coating of FIG. 3 attached to a semiconductor wafer according to an embodiment of the invention.

FIG. 4 is a cross-sectional view of treatment 300—including dicing tape 310—shown with a wafer 410 according to an embodiment of the invention. As mentioned above, treatment 300 also includes film 131 and adhesive layer 311 between dicing tape 310 and film 131. In a non-illustrated embodiment, film 131 consists of a single layer. In the embodiment shown in FIG. 4, film 131 is made up of two layers—layer 331 and layer 332 that were described above—with layer 331 being adjacent to wafer 410.

Figure 5:
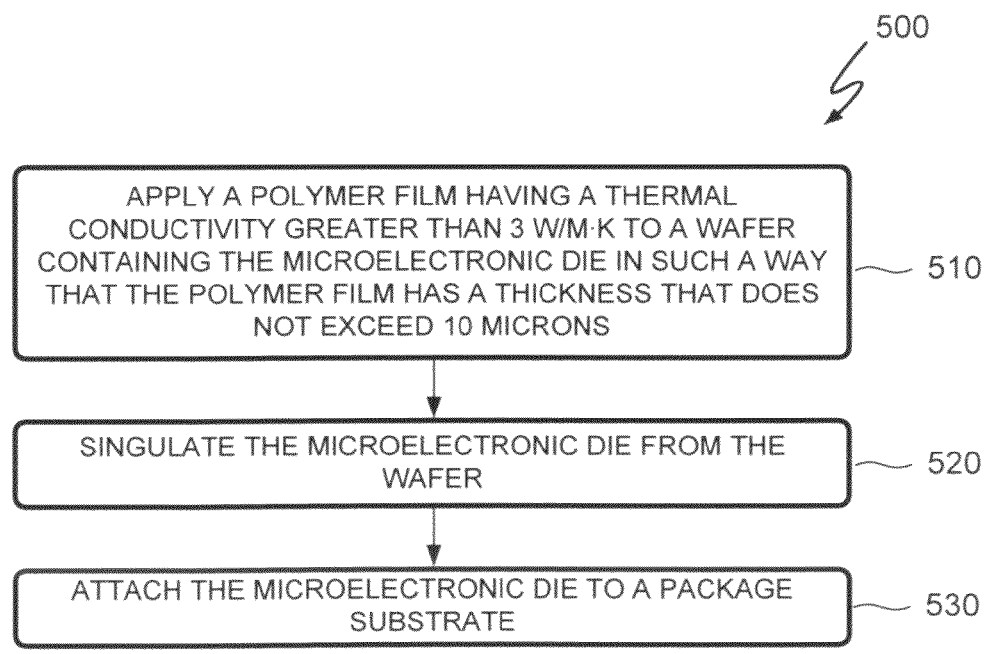
FIG. 5 is a flowchart illustrating a method of managing a thermal profile of a microelectronic die according to an embodiment of the invention.

FIG. 5 is a flowchart illustrating a method 500 of managing a thermal profile of a microelectronic die according to an embodiment of the invention. Advantageously, method 500 requires no change to existing die-prep process flows involving dicing tape or wafer-level die attach film (WLDAF), lamination, singulation, and die pickup at tape and reel die sort (TRDS). As will be described, method 500 makes use of a film that is similar to polymer film 131 that is first shown in FIG. 1. Certain steps of method 500 will be discussed with reference to one or more of FIGS. 6-8, which are cross-sectional views of treatment 300 and wafer 410 at various points in a manufacturing process according to an embodiment of the invention.

A step 510 of method 500 is to apply a polymer film having a thermal conductivity greater than 3 W/m·K to a wafer containing the microelectronic die in such a way that the polymer film has a thickness that does not exceed 10 microns. As indicated above, the polymer film can be similar to polymer film 131 that is first shown in FIG. 1. As an example, the wafer can be similar to wafer 410 that is first shown in FIG. 4.

In one embodiment, step 510 comprises laminating the film onto a backside surface of the wafer and then curing the film. In a particular embodiment, curing the polymer film comprises exposing the film to thermal radiation. As mentioned earlier, step 510 may be performed following a wafer thinning procedure.

In one embodiment, step 510 or another step comprises applying heat to the treatment during its application. Doing so may improve bonding of the polymer film to the silicon surface of the wafer.

Figure 6:
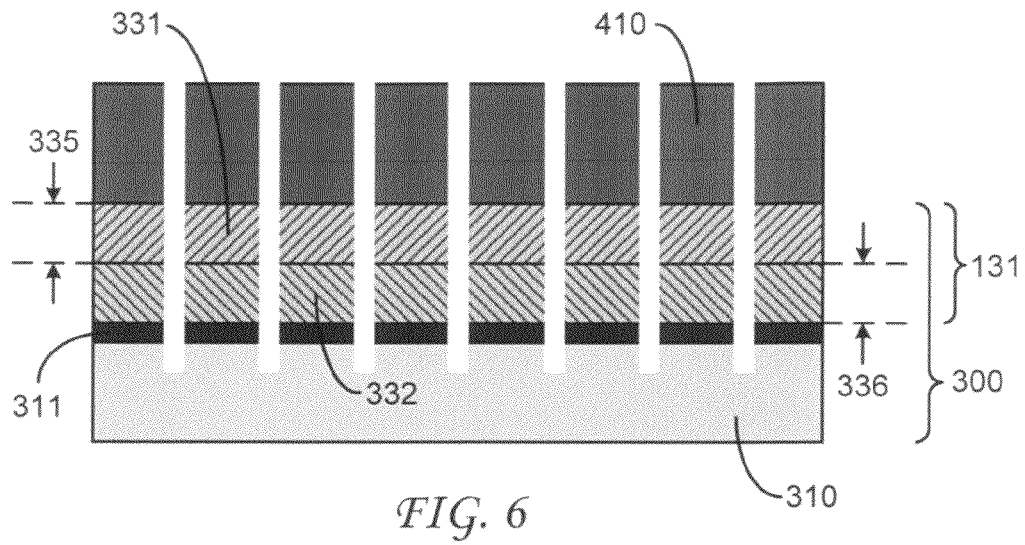
FIGS. 6-8 are cross-sectional views of the assembly of FIG. 4 at various points in a manufacturing process according to an embodiment of the invention.

A step 520 of method 500 is to singulate the microelectronic die from the wafer. As an example, step 520 may be performed using a standard process such as wafer coat+laser scribe+saw. FIG. 6 depicts an embodiment of step 520 in which dicing tape is used. As shown in FIG. 6, the saw blade (or a similar scribing or cutting tool) simultaneously cuts through wafer 410 and film 131 and into dicing tape 310. Dicing tape 310 is used to enable dicing as well as die pickup. Adhesive layer 311 may be required in order to provide a level of bonding between layer 332 of the DBF and dicing tape 310 that is sufficient to prevent any die fly-off at dicing.

After saw, the singulated die are picked in standard equipment such as TRDS. At this stage, polymer film 131 remains attached to the die. The remainder of treatment 300, i.e., dicing tape 310 and adhesive layer 311, are not transferred to the die.

Figure 7:
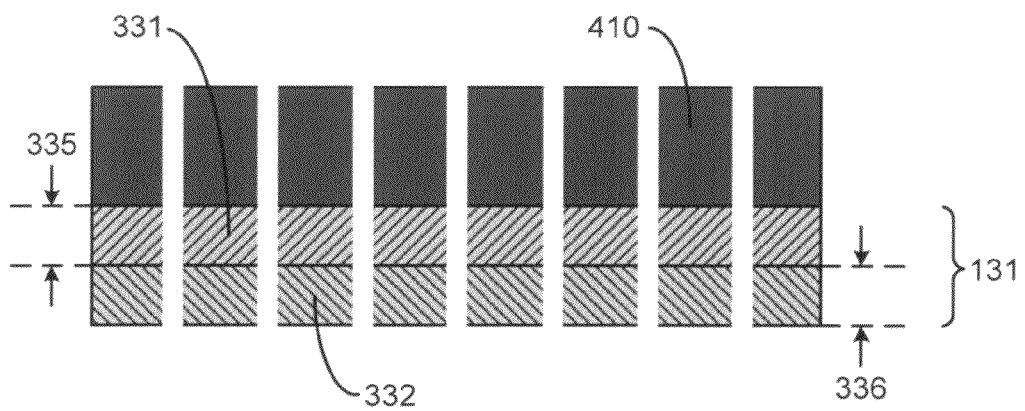

FIG. 7 depicts the singulated dies with film 131 after the dicing tape and the adhesive layer have been removed. It may be seen that the exposed surface of layer 332, according to the embodiments and concepts discussed above, is a non-tacky surface that will resist sticking to substances with which it is brought into contact during typical use.

Figure 8:
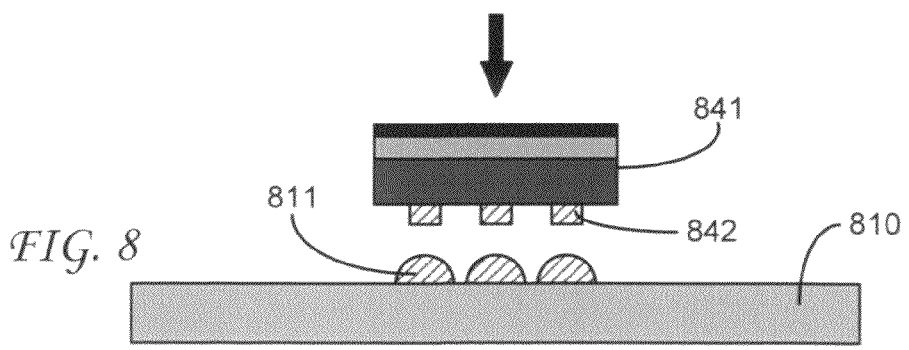

A step 530 of method 500 is to attach the microelectronic die to a package substrate. As an example, step 530 may be accomplished using a solder reflow process in which the polymer film is left exposed. FIG. 8 is a representation of a chip attach procedure in which singulated die 841 (with interconnect structures 842) is positioned over a substrate 810 having solder bumps 811 in preparation for attachment by solder reflow.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the polymer film and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A coating for a microelectronic device, the coating comprising:
    a polymer film containing a filler material, wherein the polymer film has a thermal conductivity greater than 3 W/m·K and a thickness that does not exceed 10 micrometers, where the polymer film comprises a first layer having a first thickness and a first filler content and a second layer having a second thickness and a second filler content that is greater than the first filler content.

2. The coating of claim 1 wherein:
    the polymer film has a post-cure Young's Modulus at room temperature greater than 3 GPa.

3. The coating of claim 1 wherein:
    the filler material comprises particles of at least one of tungsten, topaz, chromium, aluminum, aluminum oxide, aluminum nitride, tungsten carbide, silicon carbide, boron, boron carbide, boron nitride, nickel, nickel vanadium, graphite, carbon powder, carbon fibers, and diamond.

4. The coating of claim 3 wherein:
    the particles comprise coupling agents or epoxy amines.

5. The coating of claim 3 wherein:
    the particles have a maximum size of 1 micrometer.

6. The coating of claim 1 wherein:
    the polymer film includes a colorant.

7. The coating of claim 1 wherein:
    the first layer has a first glass transition temperature that is less than 80° Celsius and the second layer has a second glass transition temperature that is greater than 50° Celsius.

8. The coating of claim 1 wherein:
    the first thickness is equal to the second thickness.

9. The coating of claim 1 wherein:
    the first thickness is greater than the second thickness.

10. The coating of claim 1 wherein:
    the first thickness is less than the second thickness.

11. The coating of claim 1 wherein:
    the polymer film has a glass transition temperature that is greater than 50° C.

* * * * *